(12) United States Patent
Mehr

(10) Patent No.: US 11,769,713 B2
(45) Date of Patent: *Sep. 26, 2023

(54) LEAD FRAMES HAVING ROUNDED CORNERS AND RELATED PACKAGES AND METHODS

(71) Applicant: Microchip Technology Incorporated, Chandler, AZ (US)

(72) Inventor: Behrooz Mehr, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/819,460

(22) Filed: Aug. 12, 2022

(65) Prior Publication Data

US 2022/0384316 A1    Dec. 1, 2022

Related U.S. Application Data

(63) Continuation of application No. 17/314,535, filed on May 7, 2021, now Pat. No. 11,430,718.

(Continued)

(51) Int. Cl.
| | | |
|---|---|---|
| H01L 23/495 | (2006.01) | |
| H01L 21/48 | (2006.01) | |
| H01L 21/56 | (2006.01) | |

(52) U.S. Cl.
CPC ...... *H01L 23/4951* (2013.01); *H01L 21/4821* (2013.01); *H01L 21/56* (2013.01);
(Continued)

(58) Field of Classification Search
CPC ......... H01L 2924/181; H01L 23/49503; H01L 23/49548; H01L 23/49541;
(Continued)

(56) References Cited

U.S. PATENT DOCUMENTS

| | | |
|---|---|---|
| 9,859,185 B2 | 1/2018 | Tomie et al. |
| 10,079,332 B2 | 9/2018 | Fukuda et al. |

(Continued)

FOREIGN PATENT DOCUMENTS

| | | |
|---|---|---|
| JP | 2018-022772 A | 2/2018 |
| JP | 2018-113312 A | 7/2018 |

OTHER PUBLICATIONS

International Written Opinion from International Application No. PCT/US2021/070567, dated Oct. 29, 2021, 9 pages.
(Continued)

*Primary Examiner* — Alonzo Chambliss
(74) *Attorney, Agent, or Firm* — TraskBritt

(57) ABSTRACT

Lead frames for semiconductor device packages may include lead fingers proximate to a die-attach pad. A convex corner of the lead frame proximate to a geometric center of the lead frame may be rounded to include a radius of curvature of at least two times a greatest thickness of the die-attach pad. The thickness of the die-attach pad may be measured in a direction perpendicular to a major surface of the die-attach pad. A shortest distance between the die-attach pad and each one of the lead fingers having a surface area larger than an average surface area of the lead fingers may be at least two times the greatest thickness of the die-attach pad.

20 Claims, 5 Drawing Sheets

Related U.S. Application Data

(60) Provisional application No. 63/199,873, filed on Jan. 29, 2021.

(52) U.S. Cl.
CPC .. *H01L 23/49503* (2013.01); *H01L 23/49541* (2013.01); *H01L 23/49548* (2013.01); *H01L 23/49555* (2013.01); *H01L 23/49575* (2013.01); *H01L 2924/181* (2013.01)

(58) Field of Classification Search
CPC ....... H01L 23/495757; H01L 23/49555; H01L 21/4821; H01L 21/56
See application file for complete search history.

(56) References Cited

U.S. PATENT DOCUMENTS

| | | |
|---|---|---|
| 10,886,448 B2 | 1/2021 | Fukuda |
| 2007/0252247 A1 | 11/2007 | Kim et al. |
| 2008/0296746 A1 | 12/2008 | Saiki et al. |
| 2011/0068442 A1* | 3/2011 | Satoh ................ H01L 23/49551 |
| | | 257/787 |
| 2014/0367838 A1 | 12/2014 | Abbott et al. |
| 2015/0115422 A1 | 4/2015 | Jeon et al. |
| 2016/0118357 A1 | 4/2016 | Groenhuis et al. |
| 2016/0254214 A1 | 9/2016 | Makino |
| 2018/0033932 A1 | 2/2018 | Beh et al. |

OTHER PUBLICATIONS

International Search Report from International Application No. PCT/US2021/070567, dated Oct. 29, 2021, 4 pages.

* cited by examiner

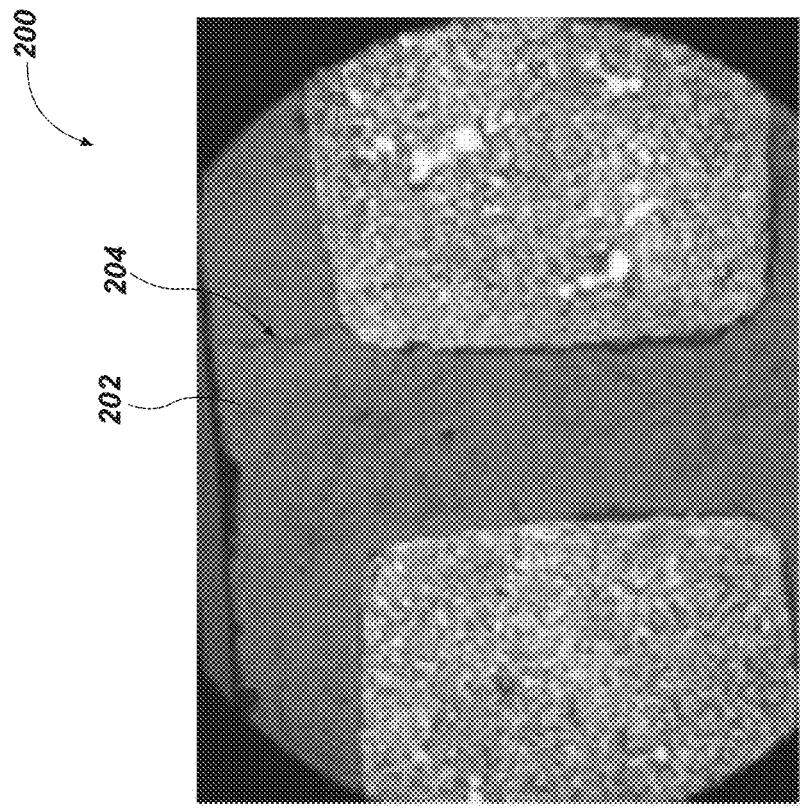
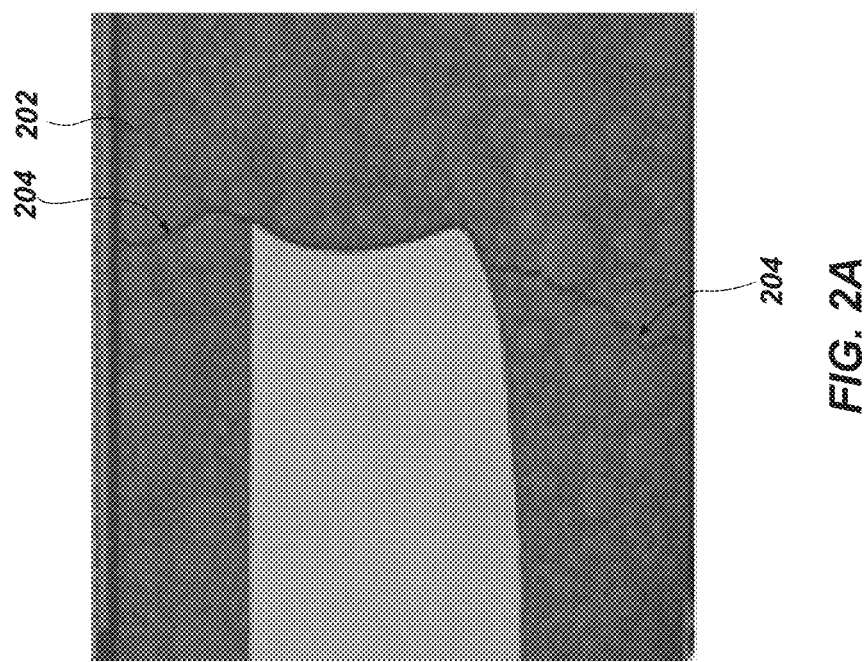
FIG. 2A
FIG. 2B

LEAD FRAMES HAVING ROUNDED CORNERS AND RELATED PACKAGES AND METHODS

CROSS-REFERENCE TO RELATED APPLICATIONS

This application is a continuation of U.S. patent application Ser. No. 17/314,535, filed May 7, 2021, now U.S. Pat. No. 11,430,718 issued Aug. 30, 2022, for "Lead Frames for Semiconductor Packages With Increased Reliability and Related Semiconductor Device Packages and Methods," which claims the benefit under 35 U.S.C. § 119 of the priority date of U.S. Provisional Patent App. Ser. No. 63/199,873, filed Jan. 29, 2021, for "Lead Frames for Semiconductor Packages with Increased Reliability," the disclosure of each of which is incorporated herein in its entirety by this reference.

FIELD

This disclosure relates generally to lead frames for semiconductor device packages. More specifically, disclosed embodiments relate to designs for lead frames for semiconductor device packages which may increase reliability and resilience to temperature cycling.

BACKGROUND

Lead frames for semiconductor device packages conventionally include a die-attach pad for supporting a semiconductor die thereon and lead fingers for routing signals to and from bond pads of the semiconductor die. For example, a full-thickness etch may be performed on a strip of electrically conductive material to form primary features of the lead frames, and a partial etch may be performed to form routing geometries for the lead frame. Such a process may be particularly applicable for so-called "quad-flat, no-leads" (QFN) form factor for lead frames, where the lead fingers and the die-attach pad are located in the same plane, portions of the lead fingers are exposed for establishing operative connections with the semiconductor device package, and a portion of the die-attach pad may be exposed to improve thermal management.

BRIEF SUMMARY

In some embodiments, lead frames for semiconductor device packages may include lead fingers proximate to a die-attach pad. A convex corner of the die-attach pad or the lead fingers proximate to a geometric center of the lead frame may be rounded and may have a radius of curvature of two times a greatest thickness of the die-attach pad, as measured in a direction perpendicular to a major surface of the die-attach pad, or greater. A shortest distance between the die-attach pad and a largest of the lead fingers may be two times the greatest thickness of the die-attach pad or greater.

In other embodiments, semiconductor device packages may include a lead frame having a die-attach pad on which a semiconductor die is supported and lead fingers electrically connected to bond pads of the semiconductor die. A convex corner of the die-attach pad or the lead fingers proximate to a geometric center of the lead frame may be rounded and may have a radius of curvature of two times a greatest thickness of the die-attach pad, as measured in a direction perpendicular to a major surface of the die-attach pad, or greater. A shortest distance between the die-attach pad and a largest of the lead fingers may be two times the greatest thickness of the die-attach pad or greater.

In other embodiments, methods of making lead frames for semiconductor device packages may involve removing material from a strip of electrically conductive material to form a series of lead frames, each having a die-attach pad and lead fingers. A convex corner of the die-attach pad or the lead fingers proximate to a geometric center of the lead frame may be formed to be rounded and to have a radius of curvature of two times a greatest thickness of the die-attach pad, as measured in a direction perpendicular to a major surface of the die-attach pad, or greater. A shortest distance between the die-attach pad and a largest of the lead fingers may be defined to be two times the greatest thickness of the die-attach pad or greater.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings. In the drawings:

FIGS. 2A and 2B are cross-sectional side views of how an encapsulant material of a semiconductor device package known to the inventor may appear under magnification after thermal cycling;

DETAILED DESCRIPTION

Figures 1A, 1B:
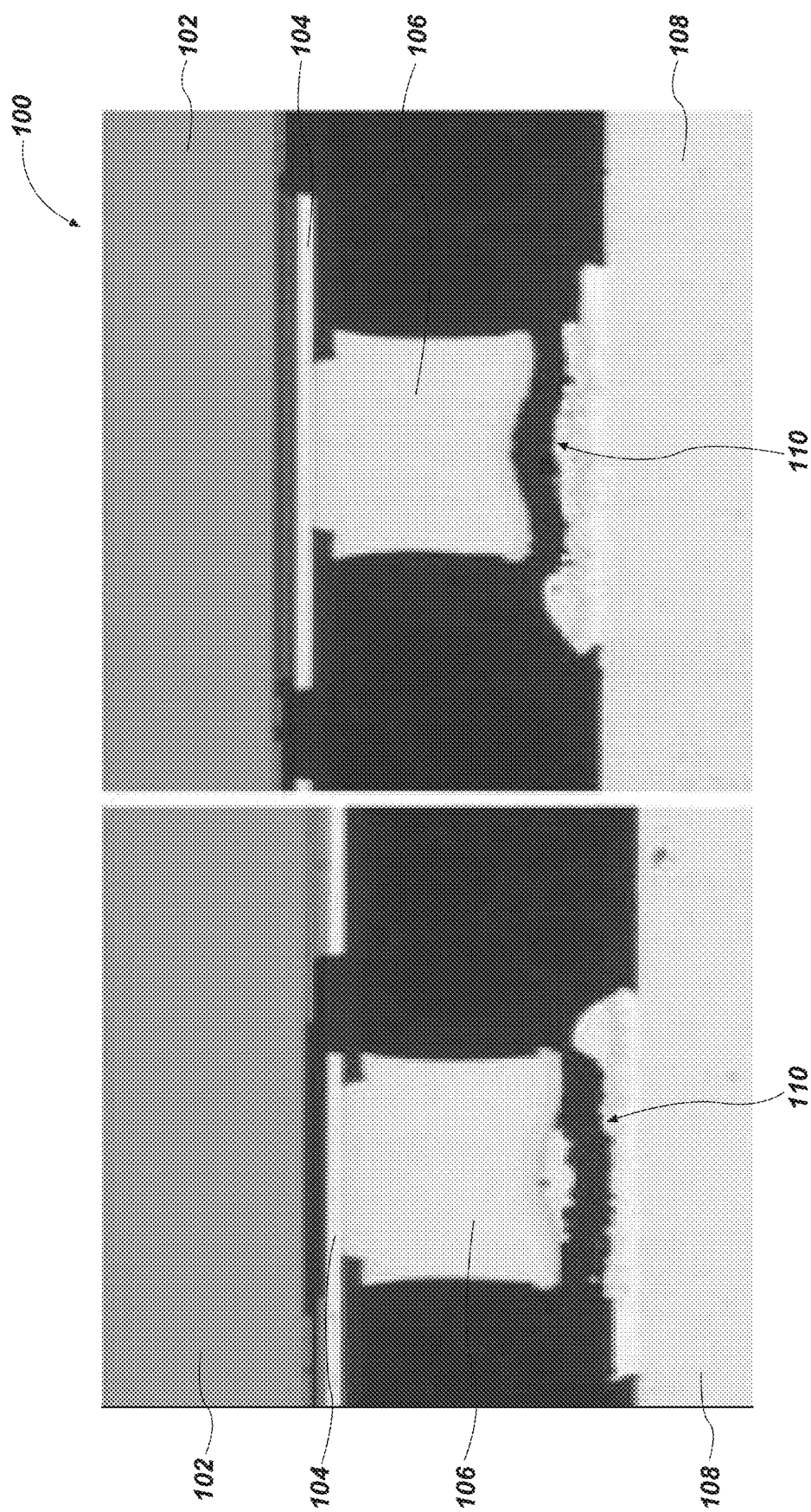
FIGS. 1A and 1B are cross-sectional side views of how a portion of a semiconductor device package known to the inventor and including an electrically conductive element between a semiconductor die and a lead frame may appear under magnification upon failure.

The illustrations presented in this disclosure are not meant to be actual views of any particular semiconductor device package, lead frame, or component thereof, but are merely idealized representations employed to describe illustrative embodiments. Thus, the drawings are not necessarily to scale.

Disclosed embodiments relate generally to designs for lead frames for semiconductor device packages which may increase reliability and resilience to temperature cycling. More specifically, disclosed are embodiments of lead frames for semiconductor device packages where at least one convex corner of the die-attach pad, or the lead fingers proximate to a geometric center of the lead frame are rounded. For example, at least one convex corner of the die-attach pad, the lead fingers proximate to the geometric center of the lead frame, or both, may be rounded, and may have a radius of curvature of two times a greatest thickness of the die-attach pad, as measured in a direction perpendicular to a major surface of the die-attach pad, or greater. In some embodiments, each convex corner of the die-attach pad may be rounded, and each may have a radius of curvature of about two times the greatest thickness of the die-attach pad or greater. In some embodiments, each convex corner of the lead fingers proximate to the geometric center of the lead frame may be rounded. Each convex corner proximate to the geometric center of the lead frame of those lead fingers having a surface area larger than an average surface area (i.e., a mean surface area) of the lead fingers may be rounded, and may have a radius of curvature of, for example, about two times the average thickness of the die-attach pad or greater. In some embodiments, at least some of the convex corners that are rounded may have a radius of curvature of between about three times and about five times the greatest thickness of the die-attach pad.

In addition, disclosed are embodiments of lead frames for semiconductor device packages where spacing between the die-attach pad and the lead fingers, and optionally between adjacent lead fingers, in positions proximate to a geometric center of the lead frame may be increased when compared to conventional designs for lead frames, particularly as applied to those lead fingers that are large in size, those lead fingers having a surface area larger than an average surface area (i.e., a mean surface area) of the lead fingers. For example, a shortest distance between the die-attach pad and a largest of the lead fingers may be about two times the greatest thickness of the die-attach pad or greater. More specifically, a shortest distance between the die-attach pad and each one of the lead fingers having a surface area larger than an average surface area (e.g., a mean surface area) of the lead fingers may be about two times the average thickness of the die-attach pad or greater. As another example, a shortest distance between the two largest of the lead fingers may be about two times the greatest thickness of the die-attach pad or greater. More specifically, a shortest distance between each one of the lead fingers having a surface area larger than an average surface area of the lead fingers may be between about three times and about five times the greatest thickness of the die-attach pad.

Reducing the sharpness of convex corners of the components of the lead frame, and increasing the spacing between components of the lead frame, may beneficially increase the resilience and reliability of the resulting semiconductor device package. For example, rounding the convex corners of components of the lead frame may reduce the likelihood that interactions between the components of the lead frame and other components of the semiconductor device package in contact with the lead frame, such as, for example, the encapsulant material and the conductive elements (e.g., solder balls, bumps, pillars, columns, etc.) connecting the semiconductor die to the lead frame, will be damaged or fail. More specifically, semiconductor device packages in accordance with this disclosure may exhibit a reduced likelihood that cracks will initiate and/or propagate in the encapsulant material and in the conductive elements of the semiconductor device packages. Features in accordance with this disclosure may reduce stress concentrations resulting from differences in rates of thermal expansion between the lead frame and the encapsulant material and semiconductor die, which may reduce the risk of failure, particularly in situations similar to those simulated by thermal cycling.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

FIGS. 1A and 1B are cross-sectional side views of a specific example of how a portion of a semiconductor device package 100 known to the inventor and including an electrically conductive element 106 between a semiconductor die 102 and a lead finger 108 of a lead frame may appear under magnification upon failure. Such a semiconductor device package 100 may include sharp convex corners for components of the lead frame, as well as close spacing for components of the semiconductor device package 100 located proximate to a geometric center of the semiconductor device package 100. "Sharp," as used in connection with convex corners herein, means and includes a radius of curvature that is one-half a maximum thickness of the structure having the convex corner, or less. For example, a convex corner of a die-attach pad having a maximum thickness of 0.25 mm will be considered "sharp" if its radius of curvature is 0.125 mm or less. "Close," as used in connection with the spacing between structures of a lead frame herein, means and includes a shortest distance between those structures that is equal to a maximum thickness of the relevant structures, or less. For example, the shortest distance between the largest lead fingers of the lead frame, i.e., those lead fingers having a surface area larger than an average surface area (i.e., a mean surface area) of the lead fingers, and the die-attach pad may be considered "close" when that shortest distance about equal to the greatest thickness of the die-attach pad or less.

As shown in FIGS. 1A and 1B, extended use of the semiconductor device package 100 may cause cracks 110 to initiate and/or propagate within the conductive elements 106 that mechanically and electrically secure the semiconductor die 102 to the lead frame (e.g., to the lead fingers 108 and/or to the die-attach pad). Propagation of such cracks 110 may ultimately form an electrical disconnection between the conductive element 106 and the bond pad 104 of the semiconductor die 102, the conductive element 106 and the lead finger 108, or between portions of the bond pad 104. Electrical disconnection may cause the semiconductor device package 100 to fail or perform in unintended ways, because of degradation in signal quality or interruption in the path for carrying electrical signals, such as, for example, those intended to be transmitted between the bond pad 104 and the lead finger 108. Stated another way, bond pad 104 and lead finger 108 are no longer in electrical communication via conductive element 106.

For example, thermal cycling of the semiconductor device package 100 was performed to simulate extended use of the semiconductor device package 100. Thermal cycling involved exposing the semiconductor device package 100 to temperatures of −65° C. to 150° C., and transitioning between those temperatures over a period of 30 minutes. The semiconductor device package 100 experienced failure within 500 cycles.

FIGS. 2A and 2B are cross-sectional side views of a specific example of how an encapsulant material 202 of a semiconductor device package 200 known to the inventor may appear under magnification after thermal cycling. Thermal cycling was performed as described previously in connection with FIGS. 1A and 1B. As shown in FIGS. 2A and 2B, extended use of the semiconductor device package 200 may cause cracks 204 to initiate and/or propagate within the encapsulant material 202 that encapsulates the semiconductor die and portions of the lead frame. Propagation of those cracks may ultimately enable contaminants to enter the semiconductor device package 200, produce electrical disconnections between components of the semiconductor device package 200, and/or produce physical damage to the semiconductor die, causing failure of the semiconductor device package 200. Similar to the semiconductor device package 100 of FIGS. 1A and 1B, the semiconductor device package 200 shown in FIG. 2 experienced failure within 500 cycles.

Figure 3:
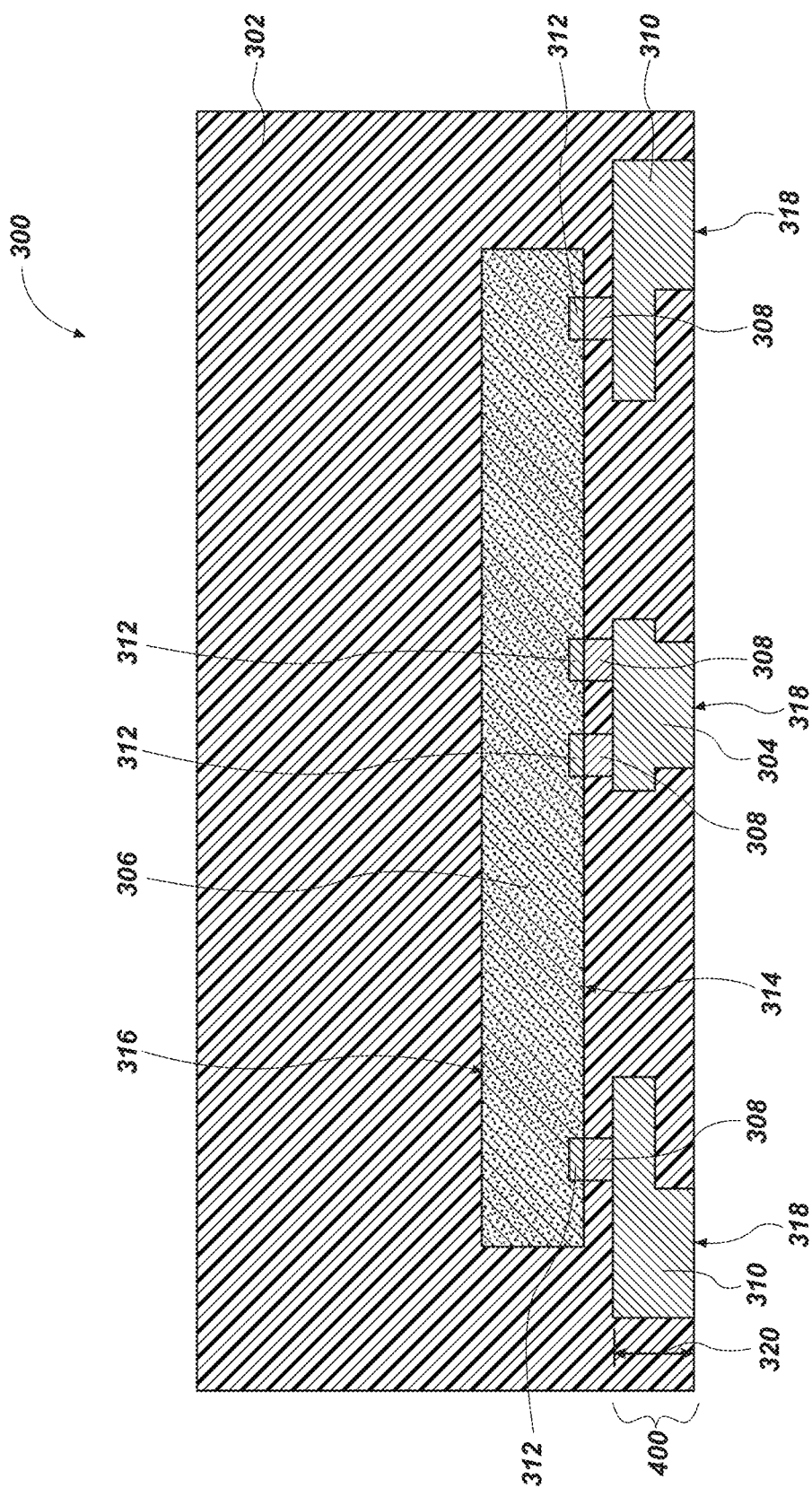
FIG. 3 is a cross-sectional side view of a semiconductor device package including a lead frame in accordance with this disclosure.
Figure 4:
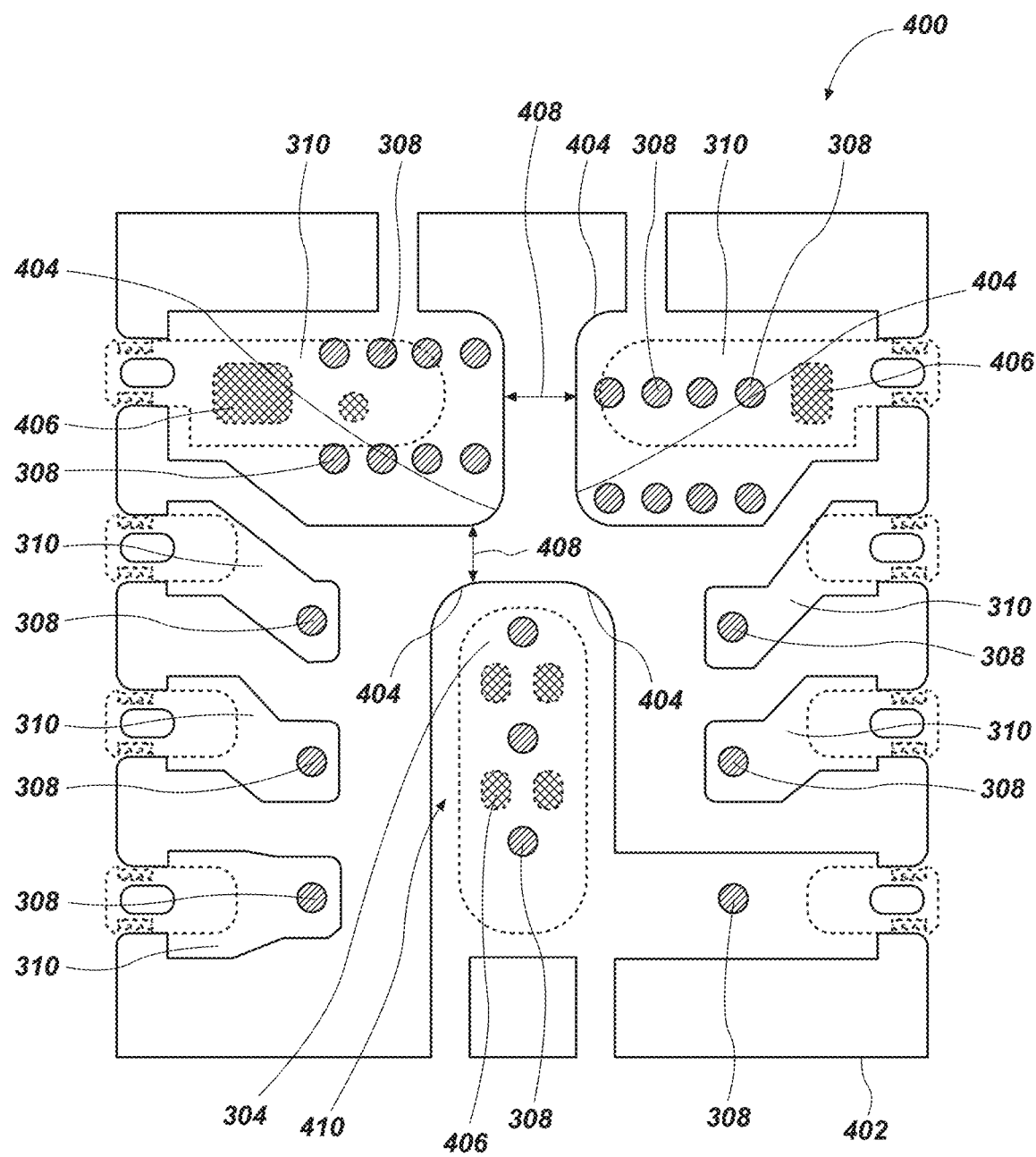
FIG. 4 is a top view of a schematic of a lead frame for a semiconductor device package in accordance with this disclosure.

FIG. 3 is a cross-sectional side view of a semiconductor device package 300 including a lead frame 400 in accordance with this disclosure. FIG. 4 is a top view of a schematic of the lead frame 400 for the semiconductor device package 300 in accordance with this disclosure. In FIG. 4, those features depicted in solid lines may represent the outline of features in an uppermost plane of the lead frame 400 as viewed from a top side of the lead frame 400. Those features depicted in dashed lines may represent the outline of features in a lowermost plane of the lead frame 400 as viewed from a bottom side of the lead frame 400. Those features depicted with hatched filling may represent locations for receiving conductive elements 308 (e.g., solder balls, bumps, pillars, columns, without limitation) that bridge between the lead frame 400 and a semiconductor die 306, and those features depicted with cross-hatched filling may represent those regions 406 having a different (e.g., a greater) surface roughness than a remainder of the surrounding surface.

With combined reference to FIG. 3 and FIG. 4, the semiconductor device package 300 may include the semiconductor die 306 configured to receive, process, and/or output signals and electrical power via bond pads 312 exposed at a first major surface 314 of the semiconductor die 306. The first major surface 314 may be configured as an active surface having integrated circuitry embedded therein and/or supported thereon, and the bond pads 312 may be electrically connected to that integrated circuitry. The semiconductor die 306 may include a second major surface 316 on a side of the semiconductor die 306 opposite the first major surface 314, and the second major surface 316 may be configured as an inactive surface, lacking any such integrated circuitry.

The semiconductor die 306 may be supported on, and electrically connected to, the lead frame 400. For example, electrically conductive elements 308 may be interposed between, and affixed to, the bond pads 312 of the semiconductor die 306 and respective locations on the lead frame 400. The electrically conductive elements 308 may include electrically conductive material (e.g., solder, conductive paste, gold, copper, aluminum, without limitation), and may be configured as, for example, bumps, balls, columns, pillars, or other structures for occupying the space between, electrically connecting, and affixing the semiconductor die 306 to the lead frame 400. Surfaces of the semiconductor die 306, bond pads 312, electrically conductive elements 308, and lead frame 400 that would otherwise be exposed may be encapsulated in an encapsulant material 302 (e.g., a curable epoxy material, without limitation). For example, the encapsulant material 302 may cover the semiconductor die 306, the conductive elements 308, any portions of the bond pads 312 extending laterally beyond the electrically conductive elements 308, and portions of the lead frame 400 other than input/output lands 318 of the lead frame 400 which may be positioned and configured to enable connection to higher-level packaging.

The lead frame 400 may include the die-attach pad 304 on which at least a portion of the semiconductor die 306 may be supported, and lead fingers 310 for routing electrical signals to and from the bond pads 312 of the semiconductor die 306. The lead fingers 310 of the lead frame 400 may be located proximate to the die-attach pad 304, with the die-attach pad 304 located generally centrally and the lead fingers generally extending from a periphery of the lead frame 400 toward the die-attach pad 304. In some embodiments, some of the bond pads 312 of the semiconductor die 306 may face, and be directly electrically connected to, the die-attach pad 304 and the lead fingers 310 via the respective electrically conductive element 308. For example, a footprint of the semiconductor die 306 may overlap with, and at least partially cover, the die-attach pad 304 and the lead fingers 310 when the semiconductor die 306 is viewed in a direction perpendicular to the first major surface 314 and/or the second major surface 316. More specifically, the semiconductor die 306 may be electrically and mechanically connected to the lead frame 400 in a flip-chip orientation, with the first major surface 314 facing the lead frame 400. In other embodiments, the first major surface 314 may face away from the lead frame 400, and wire bonds may be utilized to electrically connect the bond pads 312 to the die-attach pad 304, the lead fingers 310, or both (e.g., with certain respective bond pads 312 connected to the die-attach pad 304 and other respective bond pads 312 connected to corresponding ones of the lead fingers 310).

The lead frame 400 may be formed of an electrically conductive material, such as, for example, copper, gold, silver, aluminum, and alloys, mixtures, and other combinations thereof. The lead frame 400 may also include regions 406 (best depicted in FIG. 4) exhibiting different (e.g., higher) surface roughness than a remainder of the regions of lead frame 400, which may enable the encapsulant material 302 to better adhere to the regions 406 of the lead frame 400.

Locations for receiving the electrically conductive elements 308 mechanically and electrically connecting the lead frame 400 to the bond pads 312 of a semiconductor die 306 may be distributed over surfaces of the lead frame 400, such as on the die-attach pad 304 and on the lead fingers 310. For example, one or more bond pads 312 may be electrically connected to the die-attach pad 304 of the lead frame 400, one or more bond pads 312 may be electrically connected to each lead finger 310 having a surface area larger than an average surface area (i.e., larger than a mean surface area) of the total lead fingers 310, and a single bond pad 312 may be electrically connected to each lead finger 310 having a surface area smaller than the average surface area of the total lead fingers 310.

In accordance with this disclosure, one or more convex corners 404 of the structures of the lead frame 400 may be rounded, and spacing between respective structures of the lead frame 400 may be increased when compared to conventional designs for lead frames known to the inventor. For example, a convex corner 404 of the die-attach pad 304 or a convex corner 404 of the lead fingers 310 proximate to a geometric center of the lead frame 400 may be rounded may have a radius of curvature of at least two times a greatest thickness of the die-attach pad 304. The term "rounded," as used herein in connection with convex corners of lead frames, means and includes curved shapes having a radius of curvature of at least two times a greatest thickness of a relevant portion of the lead frame, as measured in a direction perpendicular to a major surface of that portion of the lead frame. For example, a convex corner of a die-attach pad or a lead finger of a lead frame may be considered to be "rounded" when the convex corner has a radius of curvature of two times or more than a greatest thickness of the die-attach pad or the lead finger. Many variations and permutations for implementing these high-level features may produce desirable increases in reliability. In general, it may be desirable to ensure that as many convex corners 404 of the lead frame as are encapsulated in the encapsulant material 302 may be rounded, and that the radius of curvature of those rounded convex corners 404 is as large as practicable. It may also be desirable, in general, to maintain the spacing between adjacent structures of the lead frame 400 as large as possible.

However, as the radius of curvature of the rounded convex corners 404 increases, and as the distance between adjacent structures of the lead frame 400 increases, the remaining surface area of the structures of the lead frame 400 to provide locations for connecting to bond pads 312 of an associated semiconductor die 306 may decrease. In particular, rounding the convex corners 404, increasing space between a die-attach pad 304 and lead fingers 310 of the lead frame 400, and increasing space between the lead fingers 310 themselves may leave less surface area for forming connection with bond pads 312 of the semiconductor die 306, particularly in locations proximate to a geometric center of the lead frame 400, as viewed when looking in a direction perpendicular to a major surface 410 of the die-attach pad 304. Thus, when adapting a lead frame 400 for use with a semiconductor die 306 having a particular relative size with respect to the lead frame 400, and corresponding particular layout of bond pads 312 to be connected to the lead frame 400, a person skilled in the art, in accordance with this disclosure, may need to select which convex corners 404 to round, and what radius of curvature those rounded convex corners 404 may have, as well as the spacing between respective structures of the lead frame 400, so as to ensure that the bond pads 312 of the semiconductor die 306 are alignable with a corresponding portion of the lead frame 400 while generally attempting to round the convex corners 404 with a large a radius of curvature as practicable and to space the structures of the lead frame 400 as far from one another as practicable.

As one potential variation, the lead frame 400 may be configured such that at least one convex corner 404 of the die-attach pad 304, at least one convex corner of the lead fingers 310 in positions proximate to a geometric center of the lead frame 400, or both, may be rounded, wherein the term rounded is defined as having a radius of curvature of at least two times a greatest thickness 320 of the die-attach pad 304, as measured in a direction perpendicular to the major surface 410 of the die-attach pad 304. More specifically, those rounded convex corners 404 of the die-attach pad 304, the lead fingers 310, or both, may have a radius of curvature of between about three and about five times the greatest thickness 320 of the die-attach pad 304. As a specific, nonlimiting example, one or more of the convex corners 404 of the die-attach pad 304, the lead fingers 310, or both, may have a radius of curvature of between about two times and about five times the greatest thickness 320 of the die-attach pad 304 (e.g., about three times, about four times).

As another potential variation, each convex corner 404 of the die-attach pad 304 may be rounded, and may have a radius of curvature of about two times the greatest thickness 320 of the die-attach pad 304, or greater in some embodiments. For example, each convex corner 404 of the die-attach pad 304 may be rounded and may have a radius of curvature of between about two times the greatest thickness 320 of the die-attach pad 304 and about five times the greatest thickness 320 of the die-attach pad 304. More specifically, each convex corner 404 of the die-attach pad 304 may be rounded and may have a radius of curvature of between about three times the greatest thickness 320 of the die-attach pad 304 and about five times the greatest thickness 320 of the die-attach pad 304 (e.g., about four times).

For another contemplated permutation, each convex corner 404 of the larger-than-average lead fingers 310, i.e., lead fingers 310 whose surface area is greater than the mean surface area of all of the lead fingers 310, proximate to the geometric center of the lead frame 400 may be rounded in some embodiments. For example, each convex corner 404 proximate to the geometric center of the lead frame 400 of those lead fingers 310 having a surface area larger than an average surface area (i.e., a mean surface area) of the total lead fingers 310 (as viewed in the orientation of FIG. 4) may be rounded, and may have a radius of curvature of, for example, about two times the greatest thickness 320 of the die-attach pad 304 or greater. In another example, a majority of the convex corners 404 of the lead fingers 310 having a surface area facing the semiconductor die 306 which is greater than the average surface area (i.e., a mean surface area) of the lead fingers 310 facing the semiconductor die 306 may be rounded and may have a radius of curvature of, for example, between about two times and about five times the greatest thickness 320 of the die-attach pad 304. As a specific, nonlimiting example, each convex corner 404 of those lead fingers 310 having a surface area facing the semiconductor die 306 which is larger than the average surface area (i.e., a mean surface area) of the lead fingers 310 may be rounded and may have a radius of curvature of, for example, between about two times and about five times the greatest thickness 320 of the die-attach pad 304 (e.g., about three times, about four times).

As another permutation, at least some of the convex corners 404 of each of the die-attach pad 304 and the lead fingers 310 that are rounded may have a radius of curvature of, for example, between about three times and about five times the greatest thickness 320 of the die-attach pad 304 in some embodiments. For example a majority of the convex corners 404 of each of the die-attach pad 304 and the lead fingers 310 may be rounded, and may have a radius of curvature of between about three times and about five times the greatest thickness 320 of the die-attach pad 304. In another example, each of the convex corners 404 of each of the die-attach pad 304 and the lead fingers 310 may be rounded, and may have a radius of curvature of between about two times and about five times the greatest thickness 320 of the die-attach pad 304 (e.g., about three times, about four times).

In an additional permutation, spacing between the die-attach pad 304 and the lead fingers 310, and optionally between adjacent lead fingers 310, of the lead frame 400 in positions proximate to a geometric center of the lead frame 400 may be increased when compared to conventional designs for lead frames known to the inventor, particularly as applied to those lead fingers 310 having a surface area larger than an average surface area (i.e., a mean surface area) of the lead fingers 310, in some embodiments. For example, a shortest distance 408 between the die-attach pad 304 and a largest of the lead fingers 310 may be about two times the greatest thickness 320 of the die-attach pad 304 or greater. More specifically, a shortest distance 408 between the die-attach pad 304 and each one of the lead fingers 310 having a surface area larger than an average surface area (i.e., a mean surface area) of the total lead fingers 310, as viewed in the orientation of FIG. 4, may be at least about two times the greatest thickness 320 of the die-attach pad 304. As a specific, nonlimiting example, the shortest distance 408 between the die-attach pad 304 and each one of the lead fingers 310 having a surface area larger than an average surface area (i.e., a mean surface area) of the lead fingers 310, as viewed in a direction perpendicular to the major surface 410 of the die-attach pad 304, may be between about two times and about five times the greatest thickness 320 of the die-attach pad 304 (e.g., about three times, about four times).

As another illustrative permutation, a shortest distance 408 between the two largest, as defined by surface area, of the lead fingers 310 may be about two times the greatest thickness 320 of the die-attach pad 304 or greater. More specifically, a shortest distance 408 between each one of the lead fingers 310 having a surface area larger than an average surface area (i.e., a mean surface area) of the lead fingers 310 may be between about three times and about five times the greatest thickness of the die-attach pad 304 (e.g., about four times).

Rounding convex corners 404 of the components of the lead frame 400, and increasing the spacing between components of a lead frame 400, for a semiconductor device package 300, as disclosed herein, may increase the resilience and reliability of the semiconductor device package 300. For example, rounding the convex corners 404 of components of the lead frame 400 may reduce the likelihood that relative movement between the components of the lead frame 400 and other components of the semiconductor device package 300 in contact with the lead frame 400, such as, for example, the encapsulant material 302 and the conductive elements 308 connecting the semiconductor die 306 to the lead frame 400, will be damaged or fail. More specifically, semiconductor device package 300 in accordance with this disclosure may reduce the likelihood that cracks will initiate and/or propagate in the encapsulant material 302 and in the conductive elements 308 of the semiconductor device package 300 due to mismatch in coefficient of thermal expansion between the materials of the lead frame 400, the encapsulant material 302, the semiconductor die 306, and other components of the semiconductor device package 300.

Such increases in resilience and reliability may be generally beneficial for semiconductor device packages 300, and may be of particular benefit in semiconductor device packages 300 utilized in applications benefitting from long useful life without replacement and reliability with exposure to variations in temperature. For example, semiconductor device packages 300 in accordance with this disclosure may have particular applicability in automotive, other terrestrial vehicular, aerospace, medical, and industrial applications.

Figure 5:
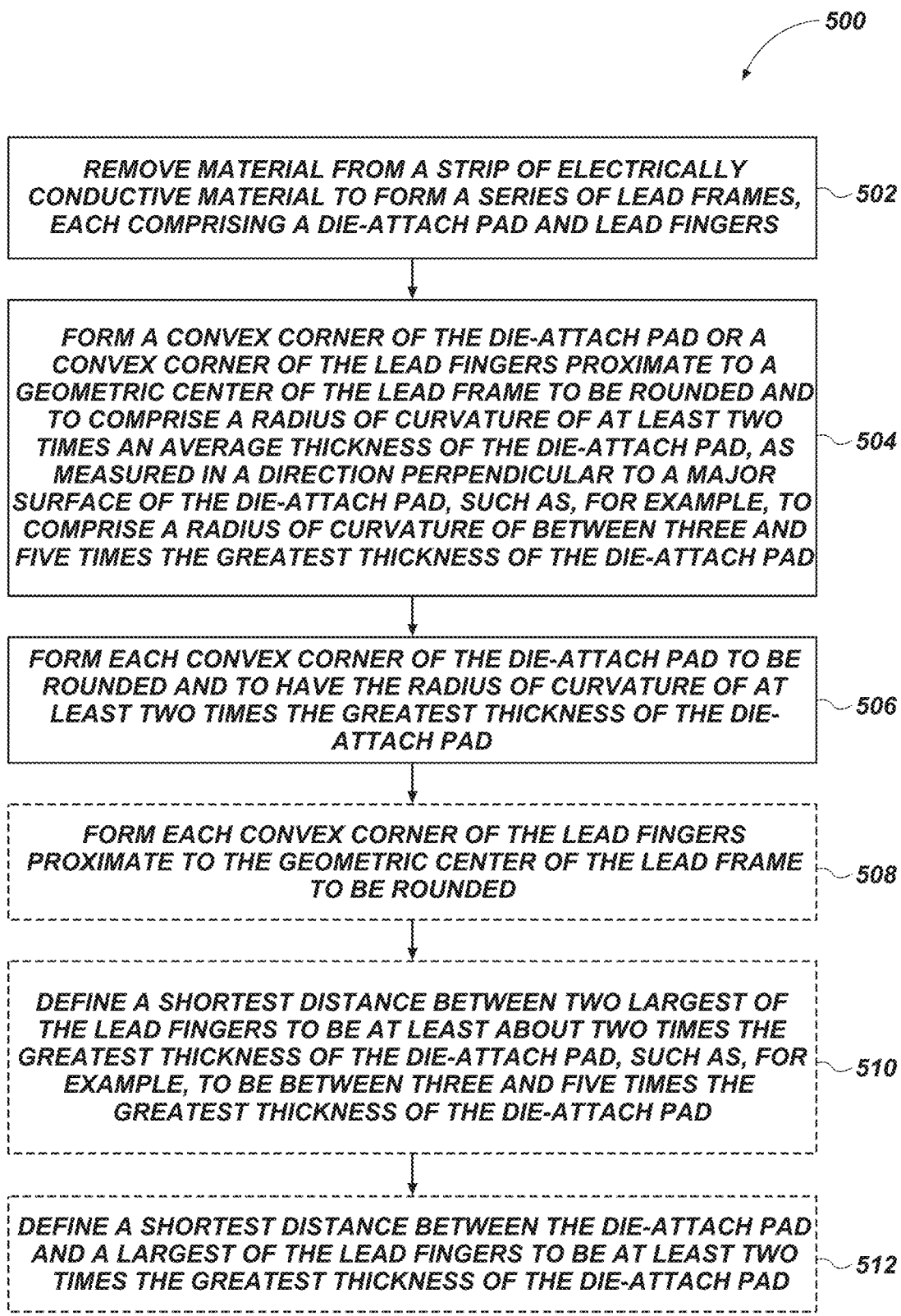
FIG. 5 is a flowchart of a method of making the lead frame of FIG. 4.

FIG. 5 is a flowchart of a method of making the lead frame of FIG. 4. The method 500 may involve, for example, removing material from a strip 402 (see FIG. 4) of electrically conductive material to form a series of lead frames 400 (see FIGS. 3, 4), each comprising a die-attach pad 304 (see FIGS. 3, 4) and lead fingers 310 (see FIGS. 3, 4), as shown at act 502. For example, removing the material from the strip 402 (see FIG. 4) to form the lead frames 400 (see FIGS. 3, 4) may involve etching, laser-cutting, machining, or otherwise applying subtractive manufacturing processes to the strip 402 (see FIG. 4) to leave the components of the lead frames 400 (see FIGS. 3, 4), and remaining support strips to be cut through when singulating semiconductor device packages 300 (see FIG. 3) from the strip 402 (see FIG. 4).

A convex corner 404 (see FIG. 4) of the die-attach pad 304 (see FIG. 4) or a convex corner of the lead fingers 310 (see FIG. 4) proximate to a geometric center of the lead frame 400 (see FIG. 4) may be formed to be rounded and to therefore comprise a radius of curvature of at least two times a greatest thickness of the die-attach pad 304 (see FIGS. 3, 4), as measured in a direction perpendicular to a major surface 410 (see FIG. 4) of the die-attach pad 304 (see FIGS. 3, 4), as shown at act 504. For example, the radius of curvature may be formed to be between three and five times the greatest thickness 320 (see FIG. 3) of the die-attach pad 304 (see FIG. 3).

In some embodiments, each (i.e., every) convex corner 404 (see FIG. 4) of the die-attach pad 304 (see FIG. 3) may be formed to be rounded and to have the radius of curvature of at least two times the greatest thickness 320 (see FIG. 3) of the die-attach pad 304 (see FIG. 3), as indicated at act 506. Each convex corner 404 (see FIG. 4) of the lead fingers 310 (see FIG. 3) proximate to the geometric center of the lead frame 400 (see FIG. 4) may be formed to be rounded in some embodiments, as indicated at act 508.

A shortest distance 408 (see FIG. 4) between the die-attach pad 304 (see FIGS. 3, 4) and a largest of the lead fingers 310 (see FIGS. 3, 4), as defined by surface area, may be defined to be at least two times the greatest thickness of the die-attach pad 304 (see FIGS. 3, 4), as shown at act 512. For example, the shortest distance 408 (see FIG. 4) between the die-attach pad 304 (see FIGS. 3, 4) and the largest of the lead fingers 310 (see FIGS. 3, 4) may be defined to be between three and five times the greatest thickness 320 (see FIG. 3) of the die-attach pad 304 (see FIGS. 3, 4). In some embodiments, the shortest distance 408 (see FIG. 4) between the die-attach pad 304 (see FIG. 3, 4) and each one of the lead fingers 310 (see FIGS. 3, 4) having a surface area larger than an average surface area of the lead fingers 310 (see FIGS. 3, 4) may be defined to be at least two times the greatest thickness 320 (see FIG. 3) of the die-attach pad 304 (see FIGS. 3, 4).

In some embodiments, a shortest distance 408 (see FIG. 4) between two largest of the lead fingers 310 (see FIGS. 3, 4), as defined by surface area, to be about two times the greatest thickness 320 (see FIG. 3) of the die-attach pad 304 (see FIG. 3) or greater, as indicated at act 510.

Reducing the sharpness of convex corners of the components of the lead frame, and increasing the spacing between components of a lead frame, for a semiconductor device package, as disclosed herein, may, for example, increase the resilience and reliability of the semiconductor device package. For example, rounding the convex corners of components of the lead frame may reduce the likelihood that relative movement between the components of the lead frame and other components of the semiconductor device package in contact with the lead frame, such as, for example, the encapsulant material and the conductive elements (e.g., solder balls, bumps, pillars, columns, etc.) connecting the semiconductor die to the lead frame, will be damaged or fail. More specifically, semiconductor device packages in accordance with this disclosure may exhibit a reduced likelihood that cracks will initiate and/or propagate in the encapsulant material and in the conductive elements of the semiconductor device packages due to mismatch in coefficient of thermal expansion between the materials of the lead frame, the encapsulant material, and the semiconductor die.

Such increases in resilience and reliability may be generally beneficial for semiconductor device packages, and may be of particular benefit in semiconductor device packages utilized in applications benefitting from long useful life without replacement and reliability with exposure to variations in temperature. For example, semiconductor device packages in accordance with this disclosure may have particular applicability in automotive, other terrestrial vehicular, aerospace, medical, and industrial applications.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure.

What is claimed is:

1. A lead frame for a microelectronic device package, comprising:
   lead fingers proximate to a die-attach pad;
   wherein a convex corner of the lead frame proximate to a geometric center of the lead frame is rounded to comprise a radius of curvature of at least two times a greatest thickness of the die-attach pad, the thickness of the die-attach pad measured in a direction perpendicular to a major surface of the die-attach pad; and
   wherein a shortest distance between the die-attach pad and each one of the lead fingers having a surface area larger than an average surface area of the lead fingers is at least two times the greatest thickness of the die-attach pad.

2. The lead frame for a microelectronic device package of claim 1, wherein the convex corner of the lead frame is a convex corner of the die-attach pad or a convex corner of the lead fingers.

3. The lead frame of claim 1, wherein the radius of curvature of the rounded convex corner of the lead frame proximate to the geometric center of the lead frame is between three and five times the greatest thickness of the die-attach pad.

4. The lead frame of claim 1, wherein each convex corner of the die-attach pad is rounded to comprise a radius of curvature of at least two times the greatest thickness of the die-attach pad.

5. The lead frame of claim 1, wherein each convex corner of the lead fingers proximate to the geometric center of the lead frame is rounded to comprise a radius of curvature of at least two times the greatest thickness of the die-attach pad.

6. The lead frame of claim 1, wherein a majority of the convex corners of the lead fingers proximate to the geometric center of the lead frame are rounded to comprise a radius of curvature of at least two times the greatest thickness of the die-attach pad.

7. The lead frame of claim 1, wherein at least one convex corner of the die-attach pad proximate to the geometric center of the lead frame is rounded to comprise a radius of curvature of at least two times the greatest thickness of the die-attach pad and at least one convex corner of the lead fingers proximate to the geometric center of the lead frame is rounded to comprise a radius of curvature of at least two times the greatest thickness of the die-attach pad.

8. The lead frame of claim 1, wherein the radius of curvature of each rounded convex corner proximate to the geometric center of the lead frame of the ones of the lead fingers having the surface area larger than the average surface area of the lead fingers is between three and five times the greatest thickness of the die-attach pad.

9. The lead frame of claim 1, wherein the shortest distance between the die-attach pad and each one of the lead fingers is between three and five times the greatest thickness of the die-attach pad.

10. The lead frame of claim 1, wherein a shortest distance between two largest of the lead fingers is at least about two times the greatest thickness of the die-attach pad.

11. The lead frame of claim 10, wherein the shortest distance between the two largest of the lead fingers is between three and five times the greatest thickness of the die-attach pad.

12. A microelectronic device package, comprising:
    a lead frame comprising a die-attach pad on which a microelectronic die is supported and lead fingers electrically connected to bond pads of the microelectronic die;
    wherein a convex corner of the lead frame proximate to a geometric center of the lead frame is rounded to comprise a radius of curvature of at least two times a greatest thickness of the die-attach pad, as measured in a direction perpendicular to a major surface of the die-attach pad; and
    wherein a shortest distance between the die-attach pad and each one of the lead fingers having a surface area larger than an average surface area of the lead fingers is at least two times the greatest thickness of the die-attach pad.

13. The microelectronic device package of claim 12, further comprising an encapsulant material encapsulating the microelectronic die and portions of the lead frame.

14. The lead frame of claim 12, wherein a shortest distance between two largest of the lead fingers is at least about two times the greatest thickness of the die-attach pad.

15. A method of making a lead frame for a microelectronic device package, comprising:
    removing material from a strip of electrically conductive material to form a series of lead frames, each comprising a die-attach pad and lead fingers;
    forming a convex corner of each lead frame proximate to a geometric center of the lead frame to be rounded so as to comprise a radius of curvature of at least two times a greatest thickness of the die-attach pad, the thickness of the die-attach pad measured in a direction perpendicular to a major surface of the die-attach pad; and
    defining a shortest distance between the die-attach pad and each one of the lead fingers having a surface area larger than an average surface area of the lead fingers to be at least two times the greatest thickness of the die-attach pad.

16. The method of claim 15, further comprising forming the radius of curvature to be between three and five times the greatest thickness of the die-attach pad.

17. The method of claim 15, further comprising forming each convex corner of the die-attach pad to be rounded so as to comprise a radius of curvature of at least two times the greatest thickness of the die-attach pad.

18. The method of claim 15, further comprising forming each convex corner of the lead fingers proximate to the geometric center of the lead frame to be rounded so as to comprise a radius of curvature of at least two times the greatest thickness of the die-attach pad.

19. The method of claim 15, further comprising defining the shortest distance between the die-attach pad and each of the lead fingers having the surface area larger than the average surface area of the lead fingers to be between three and five times the greatest thickness of the die-attach pad.

20. The method of claim 15, further comprising defining a shortest distance between two largest of the lead fingers to be at least about two times the greatest thickness of the die-attach pad.

* * * * *